(12) United States Patent
Clark

(10) Patent No.: US 11,579,197 B2
(45) Date of Patent: Feb. 14, 2023

(54) SYSTEM AND METHOD FOR INDUCTION MOTOR ROTOR BAR SURFACE MAGNETIC FIELD ANALYSIS

(71) Applicant: Brandon & Clark, Inc., Lubbock, TX (US)

(72) Inventor: Scott W. Clark, Lubbock, TX (US)

(73) Assignee: Brandon & Clark, Inc., Lubbock, TX (US)

( * ) Notice: Subject to any disclaimer, the term of this patent is extended or adjusted under 35 U.S.C. 154(b) by 194 days.

(21) Appl. No.: 17/221,819

(22) Filed: Apr. 4, 2021

(65) Prior Publication Data

US 2021/0247445 A1    Aug. 12, 2021

Related U.S. Application Data

(63) Continuation of application No. 15/894,577, filed on Feb. 12, 2018, now Pat. No. 10,969,435.

(51) Int. Cl.

| | | |
|---|---|---|
| *G01R 31/34* | (2020.01) | |
| *G01N 27/90* | (2021.01) | |
| *G01D 5/245* | (2006.01) | |
| *G01D 5/20* | (2006.01) | |
| *G01D 3/02* | (2006.01) | |
| *G01D 5/14* | (2006.01) | |

(52) U.S. Cl.
CPC ........... *G01R 31/34* (2013.01); *G01D 5/2033* (2013.01); *G01D 5/2451* (2013.01); *G01N 27/9006* (2013.01); *G01D 3/022* (2013.01); *G01D 5/147* (2013.01)

(58) Field of Classification Search
CPC . G01D 5/12–2291; G01D 5/245–2458; G01N 27/82–9093; G01R 31/34
See application file for complete search history.

(56) References Cited

U.S. PATENT DOCUMENTS

| | | |
|---|---|---|
| 2,568,406 A | 9/1951 | Packer et al. |
| 2,640,100 A | 5/1953 | Packer et al. |
| 2,999,981 A | 9/1961 | Probert |
| (Continued) | | |

FOREIGN PATENT DOCUMENTS

| | | |
|---|---|---|
| BE | 1021609 B1 | 12/2015 |
| CN | 2007-375792 | 11/2006 |

OTHER PUBLICATIONS

Greg C. Stone, Ian Culbert, Edward A. Boulter, and Hussein Dhirani, Electrical Insulation for Rotating Machines: Data, Evaluation, Aging, Testing, and Repair, Second Edition, 2014, pp. 382-385, IEEE Press, Wiley, United States.

(Continued)

*Primary Examiner* — Huy Q Phan
*Assistant Examiner* — David B Frederiksen
(74) *Attorney, Agent, or Firm* — Mason A. Gross; The Law Office of Mason A. Gross, PLLC

(57) ABSTRACT

A system for magnetic field testing comprising a magnetic field generation device configured to generate a magnetic field in a rotor, a plurality of magnetic field measurement devices configured to measure a magnetic field at a predetermined position on the rotor, a drive mechanism configured to rotate the rotor and a test system configured to record the plurality of magnetic field measurements as a function of an angular position of the rotor.

22 Claims, 3 Drawing Sheets

(56) References Cited

U.S. PATENT DOCUMENTS

| | | | |
|---|---|---|---|
| 3,875,511 | A | 4/1975 | Sims |
| 4,901,015 | A | 2/1990 | Pospischil et al. |
| 5,231,348 | A | 7/1993 | Herrick et al. |
| 5,384,534 | A | 1/1995 | Bjork |
| 6,459,276 | B1 | 10/2002 | Matthews |
| 9,739,843 | B2 | 8/2017 | Vervaeke et al. |
| 9,797,964 | B2 | 10/2017 | Vervaeke |
| 10,241,159 | B2 | 3/2019 | Vervaeke et al. |
| 10,310,029 | B2 | 6/2019 | Vervaeke et al. |
| 10,408,894 | B2 | 9/2019 | Vervaeke et al. |
| 2003/0141864 | A1 | 7/2003 | Babin |
| 2006/0006879 | A1* | 1/2006 | Mirafzal ............... G01R 31/343 324/545 |
| 2009/0315544 | A1* | 12/2009 | Takahashi ............... G01P 3/446 702/155 |
| 2012/0262160 | A1 | 10/2012 | Michalski, Jr. |
| 2013/0293221 | A1 | 11/2013 | Mialtu et al. |
| 2014/0303913 | A1* | 10/2014 | Neti ....................... G01R 31/343 702/58 |
| 2015/0276823 | A1* | 10/2015 | Rodriguez ............ G01R 31/343 702/75 |
| 2015/0276895 | A1 | 10/2015 | Vervaeke et al. |
| 2017/0038440 | A1 | 2/2017 | Verfaeke et al. |
| 2017/0038441 | A1 | 2/2017 | Vervaeke et al. |
| 2017/0123019 | A1 | 5/2017 | Vervaeke et al. |

OTHER PUBLICATIONS

Scott W. Clark, Induction Motor Rotor Bar Damage Evaluation With Magnetic Field Analysis, IEEE Transactions on Industry Applications, vol. 52, No. 2, pp. 1469-1476, Mar./Apr. 2016, United States.

Magcam Rotor Scanner, https://www.magcam.com/product/magcam_magnetic_rotor_scanner, Magcam, Leuven, Belgium.

Technology, https://www.magcam.com/content/technology, Magcam, Leuven, Belgium.

Rotor Test, https://www.risalliglobal.com/port-rotor/, Risatti Global, Turin, Italy.

Greg C. Stone & Ian Culbert the Testing Tools-Preventing failures in low and medium-voltage motors, IEEE Industry Applications Magazine, www. ieee.org/ias, Nov./Dec. 2008, pp. 48-53, IEEE, United States.

Tom Bishop Squirrel Cage Rotor Testing, EASA Convention 2003, Moscone Convention Center, San Francisco, CA, Jun. 30, 2003, pp. 1-26, Electrical Apparatus Service Association, Inc. St. Louis, MO, United States.

Tae-Kang, Jongwan Kim, Sang Bin Lee, and Chuck Yung, Experimental Evaluation Low Voltage Off-Testing for Induction Motor Rotor Fault Diagnostics, 2014, pp. 127-136, IEEE, United States.

Sebastiao Lauro Nau, Daniel Schmitz, and Waldiberto De Lima Pires, Methods to Evaluate the Quality of Stator and Rotor of Electric Motors, 2015, pp. 64-70, IEEE, United States.

Myung Jeong, Jangho Yun, Yonghyun Park, Sang Bin Lee, and Konstantinos Gyftakis, Off-line Flux Injection Test Probe for Screening Defective Rotors in Squirrel Cage Induction Machines, 2017, pp. 233-239, IEEE, United States.

Myung Jeong, Jangho Yun, Yonghyun Park, Sang Bin Lee, and Konstantinos Gyftakis, Quality Assurance Testing for Screening Defective Aluminum Die-cast Rotors of Squirrel Cage Induction Machines, IEEE Transactions on Industry Applications, 2018, pp. 1-9, DOI 10.1109/TIA.2018.2805828, IEEE, United States.

Soby T. Varghese, K. R. Rajagopal and Bhim Singh, Design and Development of Rotor Quality Test System for Die-Cast Copper Rotors, IEEE Transactions on Industry Applications, 2017, pp. 1-9, DOI 10.1109/TIA.2018.2792418, IEEE, United States.

Scott W. Clark, Induction Motor Rotor Bar Damage Evaluation with Magnetic Field Analysis, 2015, pp. 39-43, IEEE, United States.

Scott W. Clark and Daniel Stevens, Squirrel Cage Induction Motor Cast Rotor Defect Detection with Magnetic Field Analysis, 2015, pp. 1-5, IEEE, United States.

Scott W. Clark, A new method for testing rotor bars, Finding faults in the rotor bars of a squirrel cage induction motor may have gotten easier, Electrical Apparatus, Sep. 2015, pp. 29-33, Barks Publications, Inc., United States.

Scott W. Clark and Daniel Stevens, Induction Motor Rotor Bar Damage Evaluation With Magnetic Field Analysis, IEEE Transaction on Industry Applications, Mar./Apr. 2016, pp. 1469-1476, vol. 52, No. 2, IEEE, United States.

Huai-Cong Liu, Hyun-Seok Hong, Sooyoung Cho, Ju Lee, and Chang-Sung Jin, Bubbles and Blisters Impact on Diecasting Cage to the Designs and Operations of Line-Start Synchronous Reluctance Motors, IEEE Transaction on Magnetics, Jun. 2017, pp. 1-4, vol. 53, No. 6, IEEE, United States.

Clark et al., "Induction Motor Rotor Bar Damage Evaluation with Magnetic Field Analysis", Diagnostics for Electrical Machines, Power Electronics and Drives, 2015 IEEE 10th International Symposium, Sep. 1-4, 2015, pp. 39-43, IEEE, Guarda.

Rohner, "Demagnetization of large surface objects before welding", Maurer Magnetic AG—White paper, Apr. 2015, pp. 1-15, Maurer Magnetic AG, Switzerland.

Kang et al., "Experimental Evaluation of Low Voltage Off-Line Testing for Induction Motor Rotor Fault Diagnostics", Conference Paper in IEEE Transactions on Industry Applications, vol. 51, issue 2, pp. 127-136. May 2014.

Stone et al., "The Testing Tools-Preventing Failures in low and medium voltage motors", IEEE Industry Applications Magazine, Oct. 17, 2008, vol. 14, issue 6, pp. 48-53, IEEE Industry Applications Society.

Nau et al., "Methods to Evaluate the Quality of Stator and Rotor of Electric Motors", Diagnostics for Electrical Machines, Power Electronics and Drives, 2015 IEEE 10th International Symposium, Sep. 1-4, 2015, pp. 64-70, IEEE, Guarda.

Clark et al., "Squirrel Cage Induction Motor Cast Rotor Defect Detection with Magnetic Field Analysis", Electrical machines and Systems, 2015 IEEE 18th International Conference, Oct. 25-28, 2015, pp. 1019-1023, IEEE, Pattaya.

Clark, "A new method for testing rotor bars-Finding faults in the rotor bars of a squirrel cage induction motor may have gotten easier", Sep. 1, 2015 Electrical Apparatus, pp. 29-33.

Bishop, "Squirrel Cage Rotor Testing", EASA Convention 2003, Jun. 30, 2003, pp. 1-16, Electrical Apparatus Service Association, San Francisco, CA.

Office Action for U.S. Appl. No. 14/877,615, dated Dec. 23, 2016, 16 pages.

Clark et al., "Induction Motor Rotor Bar Damage Evaluation with Magnetic Field Analysis", IEEE Transactions on Industry Applications, Mar./Apr. 2016, pp. 1469-1476, vol. 52, No. 2.

Final Office Action for U.S. Appl. No. 14/877,615, dated Aug. 1, 2017, 28 pages.

Office Action for U.S. Appl. No. 14/877,615, dated Feb. 7, 2018, 23 pages.

Final Office Action for U.S. Appl. No. 14/877,615, dated Aug. 13, 2018, 31 pages.

\* cited by examiner

SYSTEM AND METHOD FOR INDUCTION MOTOR ROTOR BAR SURFACE MAGNETIC FIELD ANALYSIS

RELATED APPLICATIONS

The present application is a continuation of U.S. patent application Ser. No. 15/894,577, filed Feb. 12, 2018, now U.S. Pat. No. 10,969,435, which was an application of U.S. patent application Ser. No. 14/877,615, filed Oct. 7, 2015, now abandoned, which claimed priority to U.S. Provisional Patent Application No. 62/107,100, filed Jan. 23, 2015.

TECHNICAL FIELD

The present disclosure relates generally to motor testing, and more specifically to a system and method for induction motor rotor bar surface magnetic field testing.

BACKGROUND OF THE INVENTION

Induction motor rotor testing includes magnetic field testing that is used in conjunction with manual placement of a field generator and a visual magnetic field indicator, which is inaccurate, hazardous and which fails to create a record of the test results.

SUMMARY OF THE INVENTION

A system for magnetic field testing is provided. The system includes a magnetic field generation device configured to generate a magnetic field in a rotor, such as by placing a magnetic flux guide with a winding adjacent to the rotor and with a predetermined air gap, and by causing a current to flow in the winding. A plurality of magnetic field measurement devices are each configured to measure a magnetic field at a predetermined position on the rotor. A drive mechanism is configured to rotate the rotor, such as at a predetermined speed that is no faster than a response time of the magnetic field measurement device. A test system is configured to record the magnetic field measurements as a function of an angular position of the rotor, and to analyze the recorded data to identify damaged or broken rotor bars, such as by comparing each of the magnetic field measurements at a given angular position to a predetermined percentage of an average maximum value for each of a plurality of rotor bars.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
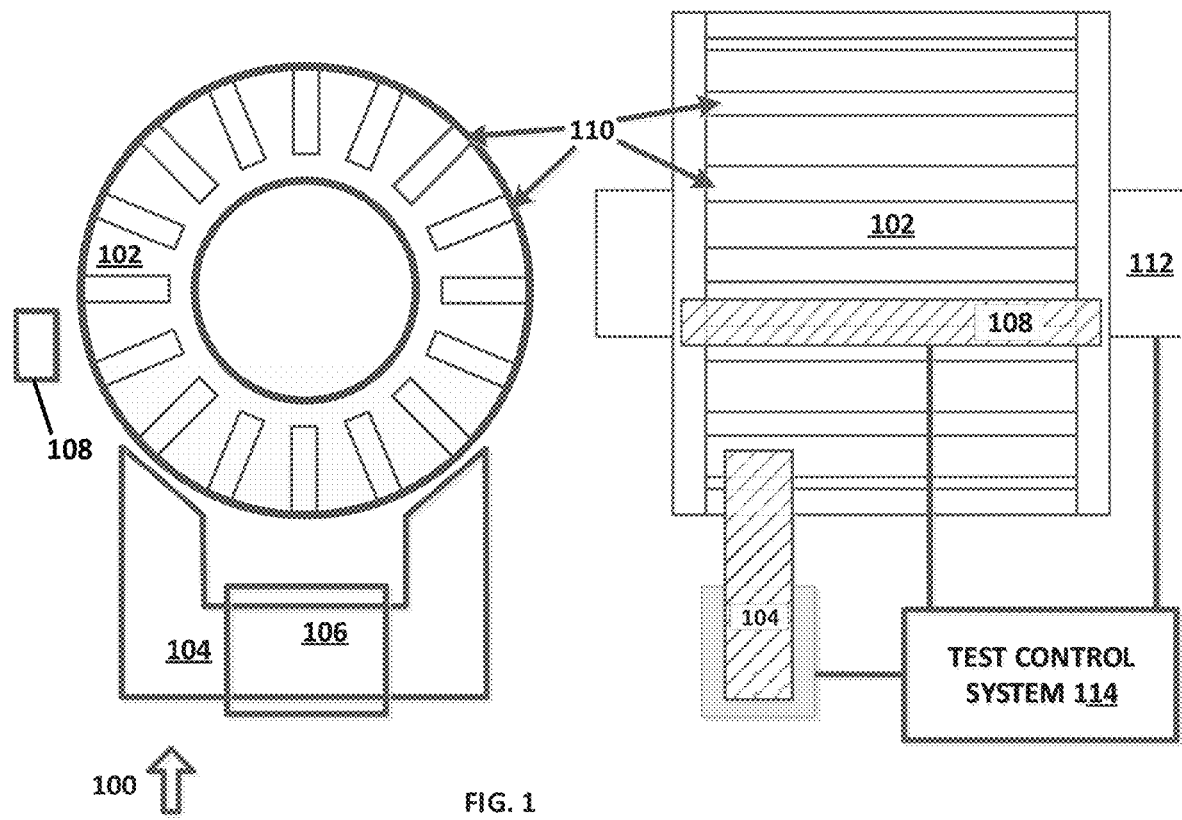
FIG. 1 is a diagram of a system for surface rotor magnetic flux field analysis testing, in accordance with an exemplary embodiment of the present disclosure.

The present application is a continuation of U.S. patent application Ser. No. 15/894,577, filed Feb. 12, 2018, now U.S. Pat. No. 10,969,435, which was a co-pending application of U.S. patent application Ser. No. 14/877,615, filed Oct. 7, 2015, now abandoned, which claimed priority to U.S. Provisional Patent Application No. 62/107,100, filed Jan. 23, 2015, both of which are hereby incorporated by reference for all purposes as if set forth entirely herein.

In the description that follows, like parts are marked throughout the specification and drawings with the same reference numerals. The drawing figures might not be to scale and certain components can be shown in generalized or schematic form and identified by commercial designations in the interest of clarity and conciseness.

Detection of defects in induction machine rotor bars is disclosed in co-pending and commonly owned U.S. application Ser. No. 14/877,615, entitled System and Method for Induction Motor Rotor Bar Magnetic Field Analysis, which is hereby incorporated by reference for all purposes as if set forth herein in its entirety. While some rotor bar defects can be detected using the Rotor Magnetic Field Analysis (RMFA) techniques disclosed therein, there are other rotor bar defects and rotor body defects that cannot be readily detected. In addition, end-ring to rotor-bar connection defects can also be detected using RMFA, but some intra-core defects at these locations and elsewhere may be difficult to detect using the RMFA analysis technique. These intra-core defect modes are difficult to detect when performing magnetic field analysis along a single axial plane if the rotor-core to rotor-bar interface resistance is low, or highly variable.

To improve the sensitivity of the test, measurement of the entire rotor surface magnetic flux density can be utilized in a surface rotor magnetic field analysis (sRMFA) technique. This technique includes the use of a magnetic field sensor array that utilizes a plurality of magnetic field flux sensors, and data processing algorithms that process the magnetic field flux measured by the magnetic field flux sensors. In one example embodiment, the entire rotor surface magnetic flux density can be measured using a linear array of sensors, in contrast to the single sensor technique used in RMFA. In this example embodiment, a typical rotor test configuration could include a suitable number of magnetic flux field sensors disposed in a linear array, such as 108, each of which generates a plurality of measurements in order to accurately measure the magnetic flux field waveform as a function of the excitation frequency. For a 60 hertz excitation signal that is measured in excess of the Nyquist sampling rate (such as at a frequency of 300 samples per second), the number of measurements for a full rotor examination could exceed 250 million per test or more, as discussed in greater detail herein. In addition, other suitable sensor array configurations are contemplated as failing within the scope of the present disclosure. For example, instead of a linear sensor array that is disposed adjacent to a single rotor bar, a circular sensor array can be used that encompasses a section of a plurality of rotor bars, so as to develop a better understanding of the impact of the magnetic flux from one rotor bar on adjacent rotor bars. While measurement of individual bars in sequence should be sufficient to obtain a complete profile of the magnetic flux density variations, it is possible that phase information or other useful information may be easier to derive using other sensor configurations, that the time required for performing the test could be reduced, or that other useful benefits may be achieved.

The test configuration of rotor test instrumentation and excitation sources for the sRMFA test can be varied from the basic test topology developed for RMFA testing, in order to improve the sensitivity of the test and to detect damage that would otherwise not be able to be detected using only RMFA testing, such as end-ring to rotor bar connection defects. Rotors of a die cast closed slot design type can be inspected using a one-turn loop current induction method, or using other suit able methods and systems as disclosed herein.

The process of examining sRMFA results can include comparing the maximum normalized flux density associated with a specific rotor bar to that of other rotor bars, either individually or based on a normalized average value, to identify statistically-significant deviations from adjacent rotor bar magnetic flux density profiles, average magnetic flux density profiles, absolute magnetic flux density values or other suit able metrics. Likewise, for end-ring to rotor bar connections, defects can be identified using analytical algorithms that are based on normalized magnetic flux profiles for rotor bars, comparison of the magnetic flux profile for a given rotor bar with the normalized magnetic flux profile, comparison of the magnetic flux profile for a given rotor bar with the magnetic flux profile for rotor bars in adjacent locations, absolute magnetic flux density readings or other suit able data. Defects associated with the rotor cage circuit, whether they be in the end ring or in the body of a rotor bar, can be detected by their effect on current flow in the rotor cage, and may result in a reduced magnetic flux density in comparison to a rotor bar which is not compromised by a defect, so comparison with other locations on the same rotor or with other rotors of the same design can provide meaningful guidance.

Several methods of rotor cage current induction are disclosed herein, based on the construction of test specimen rotors, but other suit able methods are contemplated as falling within the scope of the disclosure, as long as they provide for comparison with other locations on the same rotor, equivalent locations on other rotors with similar design features, or other suit able data. For example, one method of rotor cage current induction can utilize a non-contact exciter to induce a time varying current at a test frequency in the rotor bars, similar to that used for RMFA. Unlike RMFA, though, a linear sensor array is used to measure the magnetic flux fields at a number of locations. The linear sensor array is disposed at a radial location that is sufficiently far enough from the exciter to avoid magnetic flux density affects from the exciter from impacting the measurements for the rotor bar under examination.

Supplemental induction methods have been identified that can be used for closed-slot cast aluminum or cast copper cage designs. These closed slot designs benefit from a direct connection to the end rings of the rotor in which a DC or AC current is injected. Another supplemental method appropriate for open or closed slot rotors that may not have a shaft installed (based on the manufacturing stage of the rotor) includes testing that utilizes an AC induction loop, which is placed through the rotor core bore. Another example method of rotor current induction utilizes a completed rotor's shaft as a conductive path to induce rotor bar currents. This methodology can result in false defect indications, and additional data processing or test data may be required to properly apply this methodology. Likewise, a combination of these different methodologies or other suitable methodologies are contemplated as falling within the scope of the present disclosure.

In one example embodiment, a rotor test can be performed in a single rotation, such as by using a sampling rate that is higher than the Nyquist rate required for the applied test voltage. In this example embodiment, for a 60 Hz signal reconstruction, 300 samples per 60 Hz cycle can be used to obtain sufficient data. In order to obtain sufficient angular resolution for the data, the rotor can be rotated at a slow rate of rotation, and each linear flux density sensor can be monitored in parallel or in a predetermined sequence. Alternatively, the rotor can be rotated without activation of the linear sensor until the linear sensor is at a predetermined location above each rotor bar, and flux density measurements can then be taken. In addition, other suitable measurements can also or alternatively be taken, such as electric field measurements, heat measurements, noise measurements and so forth.

FIG. 1 is a diagram of a system 100 for surface rotor magnetic flux field analysis testing, in accordance with an exemplary embodiment of the present disclosure. System 100 includes rotor 102, magnetic flux guide 104, coil 106, sensor 108, rotor bars 110, motor 112 and test control system 114.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Rotor 102 and rotor bars 110 are part of a device under test, such as during original manufacture, repair, remanufacture or at other suitable times. Rotor 102 can be made from magnetic or other suitable materials, such as from a single solid casting, from multiple solid components, from laminations or in other suitable manners. Rotor bars 110 can be made from copper or other suitable materials, such as from copper bars, from stranded copper conductors, from hollow air or water cooled copper conductors, or in other suitable manners. Rotor bars 110 can be encased in insulation and then placed in slots in rotor 102, either before the insulation materials are cured, after the insulation materials are cured or in other suitable manners. Rotor bars 110 can also or alternatively be embedded in slots that are closed, such that alternating fields carried in such rotor bars may be shielded by the closed rotor slot.

Magnetic flux guide 104 can be made from magnetic steel, such as using a single solid piece, multiple pieces, laminations or other suitable materials. Coil 106 can be a wound copper coil or other suitable coils that are used to carry a time varying current to induce a magnetic field in magnetic flux guide 104.

Sensor 108 can be a transverse or tangential magnetometer probe array or other suitable sensors or sensor arrays that can detect magnetic fields across a wide range of magnitudes. In one exemplary embodiment, sensor 108 can be an array of scalar magnetometers, vector magnetometers, stationary or rotating coil magnetometers, Hall effect magnetometers, magnetoresistive devices, fluxgate magnetometers, superconducting quantum interference device magnetometers, vibrating sample magnetometers, pulsed field extraction magnetometers, torque magnetometers, Faraday force magnetometers, optical magnetometers, proton precession magnetometers, Overhauser effect magnetometers, cesium vapor magnetometers, potassium vapor magnetometers, other suitable magnetometers or a combination of suitable magnetometers. The selection of magnetometers will depend on the specific design characteristics of the device under test, and each different type of magnetometer can be used to test different magnetic field characteristics, depending on such design variables. In addition, other suitable sensors or sensor arrays can be provided, such as electric field sensors, heat sensors, vibration sensors or the like. The fields from these other arrays can also or alternatively be measured to generate normalized data for the rotor under test, comparative data between rotor bars, absolute magnitude data for comparison with other rotors of similar design or other suitable data.

Motor 112 can be a belt and gearbox coupled motor, a stepper motor, a servo motor, an AC motor or other suitable motors that are configured to rotate rotor 102 at a suitable speed, such as 0.02 to 2 RPM, in discrete steps, or at other suitable speeds. In one exemplary embodiment, motor 112 can be part of an automated test stand or can be implemented in other suitable manners.

Test control system 114 is coupled to coil 106, sensor 108 and motor 112, and can coordinate the performance of rotor field analysis testing. In one exemplary embodiment, test control system 114 can receive or generate rotor position indexing data that can be used to identify a rotor bar position relative to a rotor body or other rotor bars, can activate and deactivate motor 112, can energize and de-energize coil 106, can record digital or analog data from sensor 108 with associated time and identification data, can analyze the recorded data, can compare the recorded data to previously stored data and can perform other suitable functions.

In operation, system 100 can generate surface rotor magnetic flux field analysis data to identify damaged or broken rotor bars during rotor manufacturing or repair, to identify end-ring to rotor bar damage, to create a digital fingerprint of the rotor for future use and for other suitable purposes. System 100 allows surface rotor magnetic flux field analysis testing to be performed in a repeatable manner and with no risk to personnel.

Figure 2:
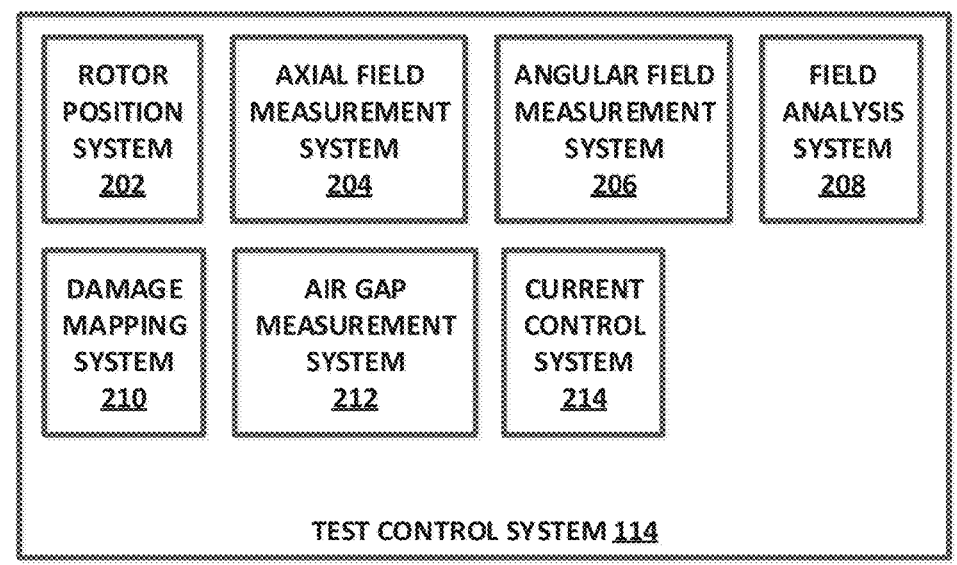
FIG. 2 is a diagram of a system for surface rotor magnetic flux field measurement and analysis, in accordance with an exemplary embodiment of the present disclosure.

FIG. 2 is a diagram of a system 200 for surface rotor magnetic flux field measurement and analysis, in accordance with an exemplary embodiment of the present disclosure. System 200 includes test control system 114 and rotor position system 202, axial field measurement system 204, angular field measurement system 206, field analysis system 208, damage mapping system 210, air gap measurement system 212 and current control system 214, each of which can be implemented in hardware or a suitable combination of hardware and software.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes a microcomputer or other suitable controller, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices) or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

Rotor position system 202 reads and stores indexing data to determine a rotor position. In one exemplary embodiment, rotor position system 202 can detect an indexing device, such as a magnetic sensor, an optical indicator, or other suitable data that can be used for rotor bar location, for indexing the rotor bars of a rotor under test. In another exemplary embodiment, rotor position system 202 can receive user-entered data that is associated with a rotor bar, such as in response to a generated sensor waveform or in other suitable manners. Rotor position system 202 can assign a rotor bar number or identifier to each of a plurality of rotor conductor bars on a rotor under test, and perform other suitable functions.

Axial field measurement system 204 receives sensor data from a linear array of magnetometers or other suitable devices, stores the sensor data, displays the sensor data and performs other suitable functions in conjunction with the sensor data. In one exemplary embodiment, axial field measurement system 204 can provide energization voltage and current to each sensor of a plurality of sensors of a linear sensor array, can read digital or analog data from the linear sensor array, can record electrical signals from each sensor of the linear sensor array, can calibrate each sensor of the linear sensor array and can perform other suitable functions. Likewise, axial field measurement system 204 can use different frequency excitation voltages to determine whether damage exists on a given rotor bar, can measure a frequency spectrum of the magnetic field to determine whether damage exists, or can use other suitable measurement techniques.

Angular field measurement system 206 receives successive sets of linear sensor array data from a linear magnetometer sensor array or other suitable devices, stores the sets of sensor data, displays the sets of sensor data and performs other suitable functions utilizing the sets of sensor data. In one exemplary embodiment, angular field measurement system 206 can provide energization voltage and current to a linear sensor system, can read digital or analog data from a linear sensor system, can record electrical signals from a linear sensor system, can calibrate a linear sensor system and can perform other suitable functions. Likewise, angular field measurement system 206 can use different frequency excitation voltages to determine whether damage exists on a given rotor bar, can measure a frequency spectrum of the magnetic field to determine whether damage exists, or can use other suitable measurement techniques. In another example embodiment, angular field measurement system 206 can compare magnetic flux density measurements from a linear array or other suitable arrays of magnetic flux density measurement devices that are obtained for a first rotor bar and can 1) compare the magnetic flux density measurements to magnetic flux density measurements for other rotor bars on the same rotor, 2) can generate normalized magnetic flux density measurements for all rotor bars of a rotor and can generate comparative data for the magnetic flux density for each rotor bar to the normalized magnetic flux density, 3) can compare the absolute magnetic flux density to the absolute magnetic flux density for other rotors having similar construction or design features, 4) can vary the excitation current and can determine the magnetic flux density response as a function of excitation current, and can perform other suitable analyses.

Field analysis system 208 receives field measurement data from axial field measurement system 204, angular field measurement system 206 and other suitable data, and analyzes the field measurement data to identify a maximum and minimum reading for each rotor bar, a maximum and minimum reading for all rotor bars of a rotor under test, to identify an angular position for each rotor bar, to determine an angular separation for each rotor bar, to identify damaged and broken rotor bars, to compare field measurement data to previously recorded field measurement data, and for other suitable purposes. While the functionality of axial field measurement system 204 and angular field measurement system 206 can overlap in some aspects with field analysis system 208, field analysis system 208 can perform additional functions that are not performed by axial field measurement system 204 or angular field measurement system 206, such as end-ring to rotor bar magnetic flux density analysis. Field analysis system 208 can analyze analog or digital data, can generate waveform displays and text reports, and can perform other suitable functions. Likewise, field analysis system 208 can analyze fields measured at different excitation frequencies to determine whether damage exists on a given rotor bar, can analyze a frequency spectrum of the magnetic field to determine whether damage exists, or can use other suitable analytical techniques.

Damage mapping system 210 receives data from axial field measurement system 204, angular field measurement system 206, field analysis system 208 and other suitable data, and generates damage mapping data to allow an operator to identify damaged or broken rotor bars or other damaged rotor components. In one exemplary embodiment, damage mapping system 210 can identify damaged and broken rotor bars by number, by an indexed angular position, can provide control data to cause a drive motor to advance a rotor under test to a predetermined position to allow a damaged or broken rotor bar to be inspected and can perform other suitable functions.

Air gap measurement system 212 measures and records air gap data for an air gap between a rotor under test and a magnetic field induction coil as a function of rotor position, such as where magnetic flux guide 104 is used to generate the excitation magnetic field for testing. In one exemplary embodiment, air gap measurement system 212 can use optical data, electrical data, acoustic data or other suitable data to measure an average air gap as a function of rotor position, to allow magnetic field measurements made during a rotor field analysis test to be calibrated and consistent with prior magnetic field measurements.

Current control system 214 can select a current type and level for an associated test. In one exemplary embodiment, current control system 214 can receive current selection data for selecting between a DC current and an AC current for a surface rotor magnetic field test, can receive a current magnitude setting for a surface rotor magnetic field test and can adjust a voltage to obtain the selected current magnitude, can vary the current magnitude as a function of a test regimen, can adjust a current magnitude to obtain a desired magnetic flux magnitude for comparison with other rotors having a similar design, and can perform other suitable functions.

In operation, system 200 performs surface rotor magnetic flux field analysis testing on a rotor to identify damaged or broken rotor bars, to create a fingerprint of the rotor under test and for other suitable purposes. System 200 automates a test apparatus and helps to protect personnel from exposure to dangerous voltage levels.

Figure 3:
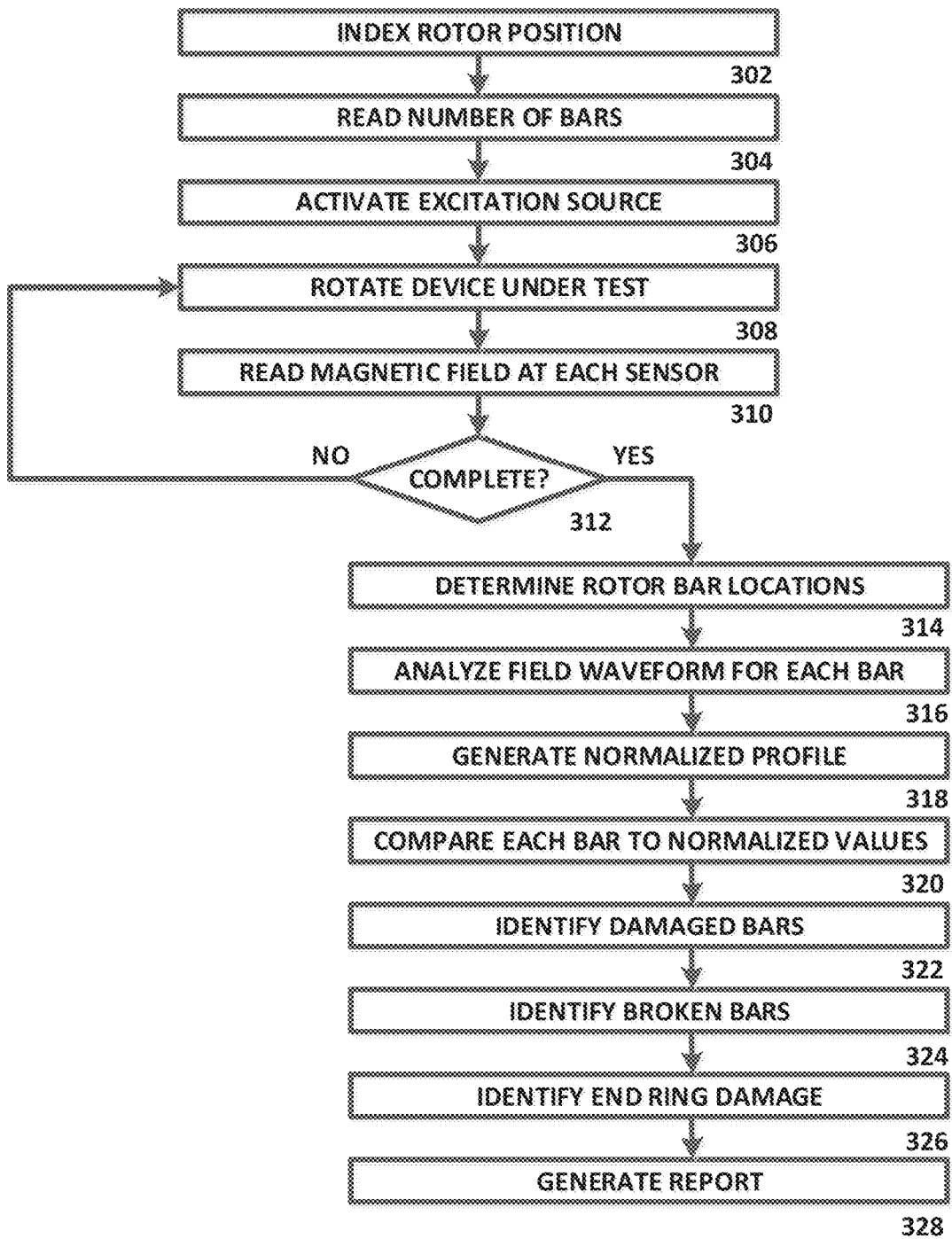
FIG. 3 is a flow chart of an algorithm for surface rotor magnetic flux field analysis, in accordance with an exemplary embodiment of the present disclosure.

FIG. 3 is a flow chart of an algorithm 300 for surface rotor magnetic flux field analysis, in accordance with an exemplary embodiment of the present disclosure. Algorithm 300 can be implemented in hardware or a suitable combination of hardware and software, and provides a special-purpose processor that can be used to control a linear flux sensor array or other suitable equipment.

Algorithm 300 begins at 302, where a rotor position is indexed. In one exemplary embodiment, a rotor can include a predetermined number of rotor bars, a rotor bar indexing device or mark or other suitable indexing features, and the rotor position can be determined at 302, such as by activating a magnetic or optical sensor while causing the rotor under test to rotate on a test stand or in other suitable manners. Likewise, a user can enter an indexing position using a data entry device, or other suitable processes can also or alternatively be used. The algorithm then proceeds to 304.

At 304, a number of rotor bars is read. In one exemplary embodiment, the number of rotor bars can be read using magnetic or optical sensors, a user can enter a number of rotor bars using a data entry device or other suitable processes can also or alternatively be used. The algorithm then proceeds to 306.

At 306, magnetic field excitation coils are energized, such as to generate a test magnetic flux field, to measure an air gap or for other suitable purposes. In one exemplary embodiment, the magnetic field excitation coils of a non-contact rotor magnetic field analysis device can be energized at different levels, using different frequencies or in other suitable manners. In another exemplary embodiment, a single loop coil through the rotor bore of a rotor under test can be energized at a predetermined level, an excitation current or voltage can be applied to the end rings of a rotor under test, an excitation current or voltage can be applied to the shaft of a rotor under test, or other suitable excitation currents or voltages can be applied. The excitation current or voltage can be an AC or DC current or voltage. The algorithm then proceeds to 308.

At 308, the rotor under test is rotated. In one exemplary embodiment, the rotor under test can be rotated at a suitable test speed, such as a speed between 0.1 and 2 revolutions per minute, can be rotated using a stepper motor to a predetermined position relative to specific rotor bar, or can be rotated in other suitable manners. The algorithm then proceeds to 310.

At 310, a magnetic field sensor reading is made and recorded at each sensor of a plurality of sensors, such as for a linear sensor array. In one exemplary embodiment, a magnetometer sensor can be used to generate an electrical signal that is proportional to a magnetic field at the magnetometer. The magnetometer can be a transverse or tangential probe, the measurements can be digital or analog, and other suitable sensor readings can also or alternatively be made. The magnetometer sensors at each location along a linear array can be actuated in series, in parallel, using a predetermined sequence or in other suitable manners. The algorithm then proceeds to 312.

At 312, it is determined whether the magnetic field measurements are complete. If the measurements are not complete, the algorithm returns to 308, otherwise the algorithm proceeds to 314.

At 314, rotor bar locations corresponding to the magnetic field measurements are determined. In one exemplary embodiment, successive maximum and minimum magnetic field measurements can be identified by waveform analysis, angular distances between adjacent magnetic field measurements can be identified based on the difference between two adjacent maxima or minima, and other suitable data processing procedures can be used to identify rotor bar locations. The algorithm then proceeds to 316.

At 316, a field waveform for each rotor bar is analyzed, such as by using a digital data analysis algorithm. In one exemplary embodiment, an excitation current or voltage waveform can be used to trigger sampling of the magnetic flux density, such as to obtain a predetermined or variable number of measurements for each sensor, so as to obtain a number of samples that is greater than the Nyquist sampling frequency at each sensor. In this exemplary embodiment, the variation in magnetic field as a function of the applied voltage waveform can be analyzed for a specific magnetic field sensor at a specific location for a specific rotor bar and can be compared to:

1) the variation in magnetic field as a function of the applied voltage waveform for the same magnetic field sensor at the same location for a different rotor bar of the same rotor;

2) the variation in magnetic field as a function of the applied voltage waveform for a different magnetic field sensor at a different location for the same rotor bar of the same rotor;

3) the variation in magnetic field as a function of the applied voltage waveform for the same magnetic field sensor at the same location for a different rotor bar of a different rotor;

4) the variation in magnetic field as a function of the applied voltage waveform for a different magnetic field sensor at a different location for a different rotor bar of the same rotor; or 5) other suitable comparisons. The analysis performed at 316 can include preparing the magnetic flux data for these algorithmic comparisons, the determination of the results of these comparisons or other related processing. The algorithm then proceeds to 318.

At 318, a normalized profile is generated. In one exemplary embodiment, the normalized profile can be generated by using the maximum magnetic flux value at each sensor location for each rotor bar, the RMS magnetic flux value at each sensor, a magnetic flux waveform at each sensor location for each rotor bar, magnetic flux values at two or more similar locations for each rotor bar (such as for both end rings) or in other suitable manners. The algorithm then proceeds to 320.

At 320, the magnetic flux density measurements for each bar are compared to the normalized values. In one example embodiment, the comparison can be made on a sensor-to-sensor basis, such as by comparing the magnetic flux density waveform at each sensor to a normalized magnetic flux density waveform, and by generating a graphic user interface that displays the differences, such as using different color coding for a current bar and the normalized waveform. In another example embodiment, the comparison can be made using the maximum magnetic flux density at each sensor for each rotor bar and the normalized values, the RMS magnetic flux density value or other suitable values. The algorithm then proceeds to 322.

At 322, any damaged rotor bars are identified. In one exemplary embodiment, the range of maximum and minimum magnetic field strengths can be identified, and stochastic thresholds can be determined by comparing measured magnetic field data values from known damaged rotor bars to the maximum and minimum values for the associated rotors, such as 80% of an average value, 80% of a maximum value and so forth. The algorithm then proceeds to 324.

At 324, broken rotor bars are identified. In one exemplary embodiment, the range of maximum and minimum magnetic field strengths can be identified, and stochastic thresholds can be determined by comparing measured magnetic field data values from known damaged rotor bars to the maximum and minimum values for the associated rotors, such as 10% of an average value, 10% of a maximum value and so forth. The algorithm then proceeds to 326.

At 326, rotor bar to end ring damage is identified. In one exemplary embodiment, the range of maximum and minimum magnetic field strengths can be identified, and stochastic thresholds can be determined by comparing measured magnetic field data values from known damaged rotor bar/end ring connections to the maximum and minimum values for the associated rotors, such as 10% of an average value, 10% of a maximum value and so forth. The algorithm then proceeds to 328.

At 328, a report is generated to indicate the location of damaged and broken rotor bars, such as to allow the location to be identified for repair, to allow service personnel to rotate the rotor to a position corresponding to a damaged or broken rotor bar or for other suitable purposes.

Although algorithm 300 is shown as a flow chart, the order of steps is exemplary and can be modified, supplemented or reduced as needed. In addition, algorithm 300 can be implemented as a state diagram, using object oriented programming or in other suitable manners.

Figure 4:
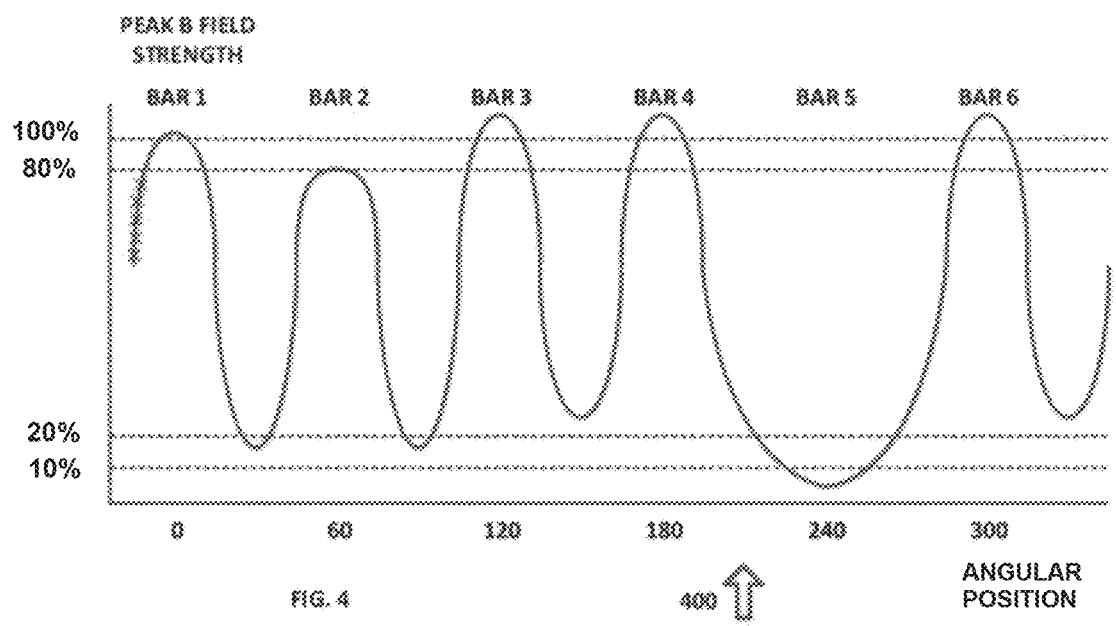
FIG. 4 is a diagram of a magnetic flux field measurement waveform in accordance with an exemplary embodiment of the present disclosure.

FIG. 4 is a diagram 400 of a peak magnetic field measurement waveform for an example 6 bar rotor, in accordance with an exemplary embodiment of the present disclosure. The peak magnetic field measurement can reflect the mean peak magnetic field measurement for each sensor of a plurality of sensors in a linear sensor array, the mean RMS value of the magnetic field measurements for each sensor of the plurality of sensors in the linear sensor array, an RMS value of each sensor, or other suitable metrics.

As shown in diagram 400, the peak magnetic field strength (or other suitable metric) varies in a roughly sinusoidal manner as a function of angular position. The 100% line shows the average maximum value, and the 80%, 20% and 10% lines show the corresponding 80%, 20% and 10% levels of the average maximum. The angular position of the six rotor bars is 0, 60, 120, 180, 240 and 300 degrees. Based on stochastically determined values of 80%, 20% and 10% levels of the average maximum, it can be seen that bar 2 would be indicated to be damaged, and bar 5 would be indicated to be broken. The analysis algorithms can use the magnetic field strength measurements as a function of angular position to determine the position of each rotor bar and whether the rotor bar is damaged or broken, as shown in the exemplary embodiment of diagram 400, such as by comparing the magnetic field strength measured at a given angular position with the magnetic field strength measured within an angular range equal to 360 divided by the number of rotor bars, by determining a series of peak values of magnetic field strength and the angular position between each peak, by comparing the maximum and minimum magnetic field strength measurements for each rotor bar to the average values for all rotor bars, or in other suitable manners.

In addition, the areas marked "X" are representative of points at which magnetic flux density readings can be taken as the rotor under test is rotated. These readings can be further analyzed to detect damage other than rotor bar gross defects, as a function of the linear location of the sensor on the linear sensor array as it corresponds to a location along the length of the rotor. For example, sensors at or near the ends of the linear sensor array can overlap the end ring and may indicate end ring damage or end ring to rotor bar damage, whereas sensors disposed in the main body of the rotor can indicate local rotor bar defects, local rotor body damage or other defects. In addition, the magnetic flux density waveforms can be further analyzed at locations where damage appears to be present to further evaluate the type of damage, such as where empirical data has been compiled that can be used to correlate specific types of magnetic flux density variations to specific types of damage. In one example, damage to the rotor body between slots can result in a different magnetic flux density variation than damage to the rotor body at the bottom of a slot, such as due to phase differences, magnetic flux density waveform differences or the like, and the sRMFA testing allows such details to be compiled and used to analyze damage.

Figure 5:
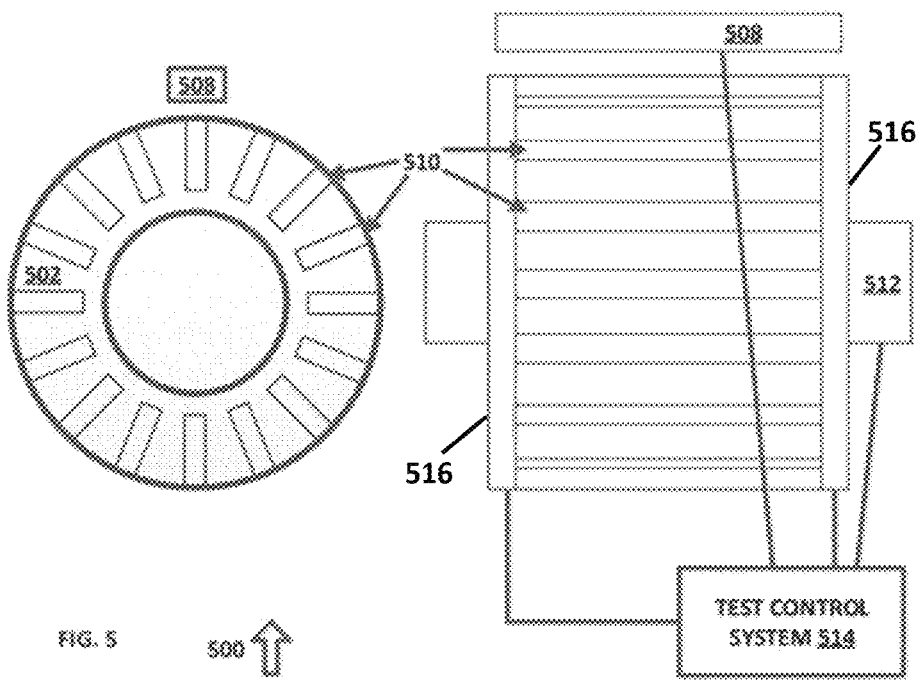
FIG. 5 is a diagram of a system for surface rotor magnetic flux field analysis testing, in accordance with an exemplary embodiment of the present disclosure.

FIG. 5 is a diagram of a system 500 for rotor field analysis testing, in accordance with an exemplary embodiment of the present disclosure. System 500 includes rotor 502, sensor 508, rotor bars 510, motor 512, test control system 514 and end rings 516.

Rotor 502, rotor bars 510 and end rings 516 are part of a device under test, such as during original manufacture, repair, remanufacture or at other suitable times. Rotor 502 can be made from magnetic steel or other suitable materials, such as from a single solid casting, from multiple solid components, from laminations or in other suitable manners. Rotor bars 510 can be made from copper or other suitable materials, such as from copper bars, from stranded copper conductors, from hollow air or water cooled copper conductors, or in other suitable manners. Rotor bars 510 can be encased in insulation and then placed in slots in rotor 502, either before the insulation materials are cured, after the insulation materials are cured or in other suitable manners. End rings 516 can be made from the same material as rotor 502 or rotor bars 510 or different materials, and are normally mechanically and electrically coupled to rotor bars 510.

Sensor 508 can be a transverse or tangential magnetometer probe array or other suitable sensors or sensor arrays that can detect magnetic fields across a wide range of magnitudes. In one exemplary embodiment, sensor 508 can be an array of scalar magnetometers, vector magnetometers, stationary or rotating coil magnetometers, Hall effect magnetometers, magnetoresistive devices, fluxgate magnetometers, superconducting quantum interference device magnetometers, vibrating sample magnetometers, pulsed field extraction magnetometers, torque magnetometers, Faraday force magnetometers, optical magnetometers, proton precession magnetometers, Overhauser effect magnetometers, cesium vapor magnetometers, potassium vapor magnetometers, other suitable magnetometers or a combination of suitable magnetometers. The selection of magnetometers will depend on the specific design characteristics of the device under test, and each different type of magnetometer can be used to test different magnetic field characteristics, depending on such design variables. In addition, other suitable sensors or sensor arrays can be provided, such as electric field sensors, heat sensors, vibration sensors or the like. The fields from these other arrays can also or alternatively be measured to generate normalized data for the rotor under test, comparative data between rotor bars, absolute magnitude data for comparison with other rotors of similar design or other suitable data.

Motor 512 can be a belt and gearbox coupled motor, a stepper motor, a servo motor, an AC motor or other suitable motors that are configured to rotate rotor 502 at a suitable speed, such as 0.02 to 2 RPM or at other suitable speeds. In one exemplary embodiment, motor 512 can be part of an automated test stand or can be implemented in other suitable manners.

Test control system 514 is coupled to sensor 508, motor 512 and end rings 516, and can coordinate the performance of rotor field analysis testing. In one exemplary embodiment, test control system 514 can receive or generate rotor position indexing data that can be used to identify a rotor bar position relative to a rotor body or other rotor bars, can activate and deactivate motor 512, can provide AC or DC power to end rings 516, can record digital or analog data from sensor 508 with associated time and identification data, can analyze the recorded data, can compare the recorded data to previously stored data and can perform other suitable functions. For example, test control system 514 can include the functionality of test control system 200 or other suitable test control functionality. The connections to end rings 516 can be made at a single location, in multiple locations, can be formed by bolting or welding a connection to the end rings or in other suitable manners. Also or alternatively, the excitation current for the test can be provided by a single or multiple turn coil using a conductor that is extended through the bore of rotor 502, by forming a connection to the shaft of rotor 502 and using the shaft to conduct the excitation current or in other suitable manners.

In operation, system 500 can generate surface rotor magnetic flux density field analysis data to identify damaged or broken rotor bars during rotor manufacturing or repair, to detect rotor body damage, to detect end ring to rotor bar damage, to create a digital fingerprint of the rotor for future use and for other suitable purposes. System 500 allows surface rotor magnetic field flux density analysis testing to be performed in a repeatable manner and with no risk to personnel.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

The invention claimed is:

1. A system for magnetic field testing comprising:
   a magnetic field generation device configured to generate a magnetic field in a rotor having a plurality of rotor bars, each embedded in the rotor;
   an array of magnetic field measurement devices, each configured to measure a magnetic field at a predetermined position on the rotor;
   a drive mechanism configured to rotate the rotor about a rotational axis;
   a test system configured to record the magnetic field measured by each of the magnetic field measurement devices as a function of an angular position of the rotor about the axis and to determine whether damage is present in association with one or more of the rotor bars; and
   wherein the magnetic field generation device is disposed at an angular position about the axis different from an angular position of the array of magnetic field measurement devices about the axis for any rotational position of the rotor about the axis.

2. The system of claim 1 wherein the array of magnetic field measurement devices is configured to measure tangential or transverse magnetic fields.

3. The system of claim 1 wherein the magnetic field generation device does not generate a magnetic field directly measurable by the magnetic field measurement devices.

4. The system of claim 1 wherein the test system is configured to compare each of the magnetic field measurements to a predetermined magnetic field value associated with a position of an associated magnetic field measurement device.

5. The system of claim 1 wherein the test system is configured to compare each of the magnetic field measurements to a predetermined minimum magnetic field value associated with a position of an associated magnetic field measurement device.

6. The system of claim 1 wherein the test system is configured to compare each of the magnetic field measurements to a predetermined maximum magnetic field value associated with a position of an associated magnetic field measurement device.

7. The system of claim 1 wherein the test system is configured to compare each of the magnetic field measurements to a predetermined minimum magnetic field range associated with a position of an associated magnetic field measurement device.

8. The system of claim 1 wherein the test system is configured to compare each of the magnetic field measurements to a predetermined maximum magnetic field range associated with a position of an associated magnetic field measurement device.

9. The system of claim 1 wherein the test system is configured to compare a first magnetic field maximum value to a second magnetic field maximum value as a function of a position of an associated magnetic field measurement device.

10. The system of claim 1 wherein the test system is configured to compare a first magnetic field minimum value to a second magnetic field minimum value as a function of a position of an associated magnetic field measurement device.

11. The system of claim 1 wherein the test system is configured to compare a first magnetic field maximum value to a plurality of second magnetic field maximum values as a function of a position of an associated magnetic field measurement device.

12. The system of claim 1 wherein the test system is configured to compare a first magnetic field minimum value to a plurality of second magnetic field minimum values as a function of a position of an associated magnetic field measurement device.

13. The system of claim 1 wherein the array of magnetic field measurement devices comprises a plurality of sensors, and wherein the test system is configured to measure a maximum magnetic field value and a minimum magnetic field value associated with each of the plurality of sensors for each of the plurality of rotor bars.

14. The system of claim 1 wherein the array of magnetic field measurement devices comprises a plurality of sensors, and wherein the test system is configured to measure a maximum magnetic field value and a minimum magnetic field value associated with each of the plurality of sensors for each of a plurality of rotor bars and to receive an indication of whether each rotor bar is damaged or undamaged.

15. The system of claim 1 wherein the array of magnetic field measurement devices comprises a plurality of sensors, and wherein the test system is configured to measure a maximum magnetic field value and a minimum magnetic field value associated with each of the plurality of sensors for each of a plurality of rotor bars and to compare the maximum magnetic field value and the minimum magnetic field value for each of the plurality of sensors to a predetermined acceptable range of maximum magnetic field values and minimum magnetic field values.

16. The system of claim 1 wherein the array of magnetic field measurement devices comprises a plurality of sensors, and wherein the test system is configured to measure a maximum magnetic field value and a minimum magnetic field value associated with each of the plurality of sensors for each of the plurality of rotor bars, to compare the maximum magnetic field value and the minimum magnetic field value to a predetermined acceptable range of maximum magnetic field values and minimum magnetic field values for each of the plurality of sensors, and to generate an indication if one or both of the maximum magnetic field value and the minimum magnetic field value for each of the plurality of sensors for each rotor bar exceeds a predetermined range associated with the maximum magnetic field value and the minimum magnetic field value.

17. The system of claim 1 wherein the array of magnetic field measurement devices comprises a plurality of sensors, and wherein the test system is configured to measure a maximum magnetic field value and a minimum magnetic field value associated with each of the plurality of sensors for each of the plurality of rotor bars and to generate an average value of the measured maximum magnetic field values and minimum magnetic field values.

18. The system of claim 1 wherein the magnetic field generation device is configured to generate an excitation current in end rings of the rotor and each of the rotor bars of the rotor, and wherein the array of magnetic field measurement devices comprises sensors configured to overlap the end rings.

19. The system of claim 1 wherein the magnetic field generation device is configured to apply a voltage to end rings of the rotor and generate a sequence of magnetic field magnitudes in the end rings and each of the rotor bars of the rotor, and wherein the array of magnetic field measurement devices comprises sensors configured to overlap the end rings.

20. The system of claim 1 wherein the magnetic field generation device is configured to generate an excitation current or voltage in end rings of the rotor and each of the rotor bars of the rotor.

21. The system of claim 1 wherein the magnetic field generation device is configured to apply a current or voltage to end rings of the rotor and generate a sequence of magnetic field magnitudes in the end rings and each of the rotor bars of the rotor.

22. The system of claim 1 wherein the array of magnetic field measurement devices is positioned along a full length of a rotor bar and configured to measure, at one or more positions along the full length of the rotor bar, one or more magnetic fields corresponding to the magnetic field generated by the magnetic field generation device.

* * * * *